United States Patent [19]

Waldron

[11] 4,237,421

[45] Dec. 2, 1980

[54] SINGLE-ELECTRODE CAPACITANCE TOUCHPAD SENSOR SYSTEMS

[75] Inventor: Wesley K. Waldron, Scotia, N.Y.

[73] Assignee: General Electric Company, Schenectady, N.Y.

[21] Appl. No.: 952,705

[22] Filed: Oct. 19, 1978

[51] Int. Cl.³ .................. H03K 3/26; G08B 13/26
[52] U.S. Cl. .............................. 328/5; 307/116; 307/308; 340/562
[58] Field of Search .............. 328/5; 307/308, 116; 331/65; 340/552, 365 C; 202/DIG. 1

[56] References Cited

U.S. PATENT DOCUMENTS

| | | | |
|---|---|---|---|
| 3,846,780 | 11/1974 | Gilcher | 340/562 |
| 3,846,791 | 11/1974 | Foster | 307/308 |
| 3,893,035 | 7/1975 | Higgens | 307/307 |
| 4,016,490 | 4/1977 | Weckenmann et al. | 200/DIG. 1 |
| 4,107,555 | 8/1978 | Haas et al. | 328/5 |
| 4,136,291 | 1/1979 | Waldron | 307/308 |

OTHER PUBLICATIONS

IBM Tech. Disclre. Blttn., Toch-Sensing Circuit, J. A. Williams vol. 17, No. 1, 6/74 pp. 166 & 167.

Primary Examiner—Stanley D. Miller, Jr.
Assistant Examiner—B. P. Davis
Attorney, Agent, or Firm—Geoffrey H. Krauss; Marvin Snyder; James C. Davis

[57] ABSTRACT

Each of an array of capacitive touchpad sensors has a single touchpad electrode fabricated upon a substrate and accessible to user personnel, with series coupling and shunt capacitance being provided respectively between a driving generator and the touchpad electrode, and the touchpad electrode and an array ground. Each capacitive touchpad sensor operates with a sense amplifier to provide a high density sensor array requiring relatively low driving voltage amplitudes and may be utilized with driven shields and a normalization network to provide reliable capacitance sensing with reduced sensitivity to contamination of the surface of the sensor array.

20 Claims, 8 Drawing Figures

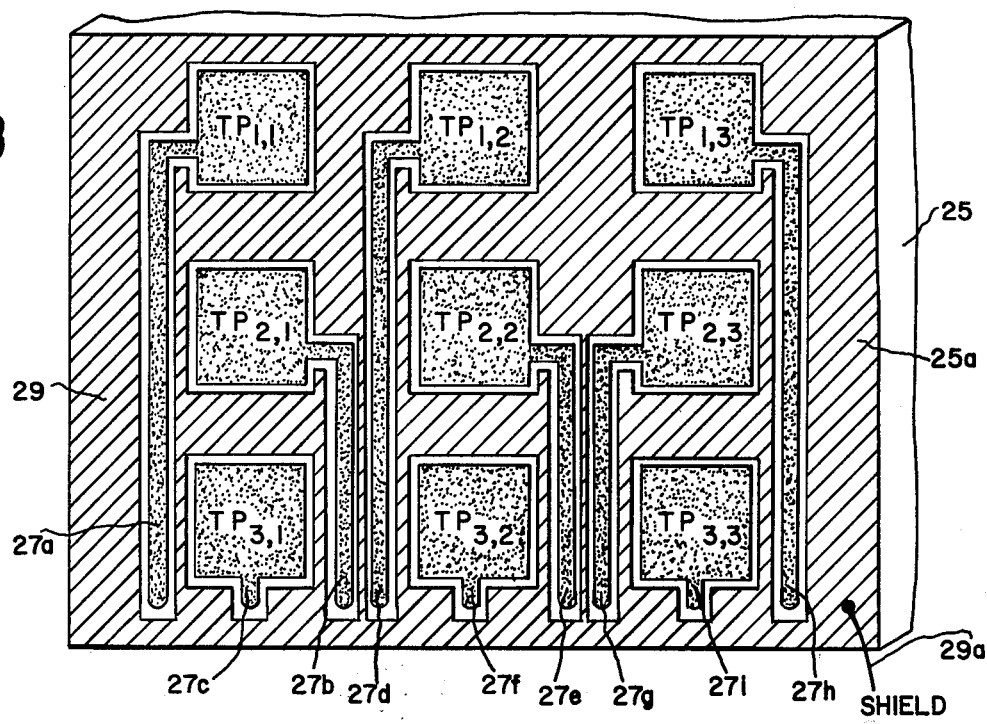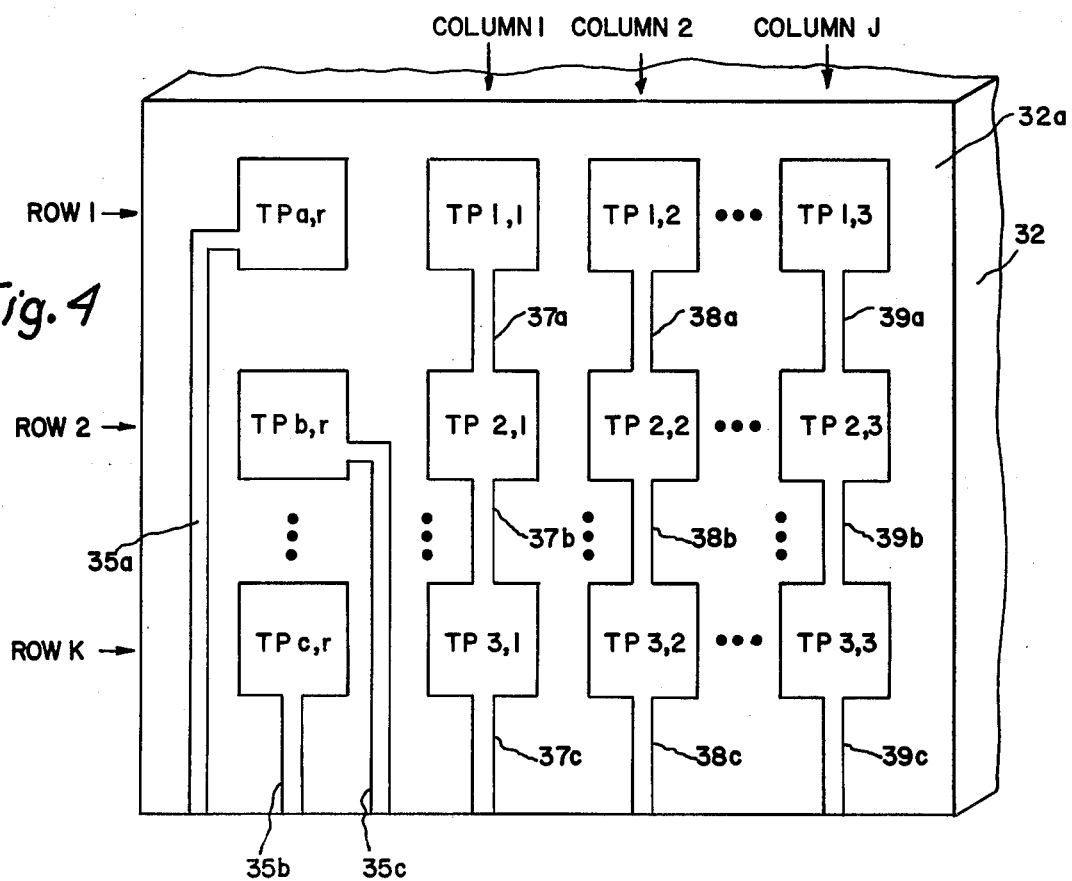

SINGLE-ELECTRODE CAPACITANCE TOUCHPAD SENSOR SYSTEMS

BACKGROUND OF THE INVENTION

The present invention relates to user-actuated sensors and, more particularly, to a novel single electrode capacitance touchpad sensor and related system electronics.

Conventional capacitance touchpad devices typically require three separate electrodes, fabricated upon at least one surface of a supporting substrate. Typically, the touchpad electrode is fabricated upon the opposite side of a relatively thick dielectric substrate from the remaining two electrodes and may require an area of about one square inch. Even with relatively large touchpad electrode areas, the active capacitance of the sensor is typically less than 5 picofarads, whereby geometry variations, mask registration or parasitic capacitance problems will typically result in device capacitance variations of up to 2 picofarads, and create a device of extreme sensitivity to design process variations. Thus, the conventional touchpad sensor devices, being of a relatively high impedance design, exhibit significant performance differences between sensors, even when several sensors are arrayed upon the same substrate and fabricated simultaneously. It is known to alleviate parasitic capacitance coupling problems by utilizing relatively large device areas and relatively large amplitude of driving voltages. It is desirable to provide arrays of capacitive touchpad sensors having both a reduced sensor area, to provide for greater sensor density in the array, and with reduced requirements for the amplitude of the drive voltages, to provide greater safety to user personnel (contacting the touch electrodes upon which at least a portion of the drive voltage appears) and to reduce driving and sensing circuit complexity and attendant cost.

BRIEF SUMMARY OF THE INVENTION

In accordance with the invention, a novel single-electrode capacitance touchpad sensor, for use in touchpad sensor arrays, comprises a single electrode fabricated upon the surface of a substrate and forming a touchpad capable of being contacted by user personnel to activate the sensor. The differential input of a sense amplifier is connected between the touchpad electrode and the electrical ground bus of the array, with a coupling capacitor being utilized between a pulse generator driving the sensor and the touch electrode. The input capacitance of the sense amplifier and other parasitic capacitance appear in shunt from the touch electrode to system ground. The touchpad electrode is a circuit node formed of any conductive or semiconductive material deposited upon the dielectric substrate. Contacting the touch electrode introduces the body-to-ground capacitance into the electrode node. The user capacitance is greater than the coupling capacitance (from the sensor driver) which is in turn greater than the input capacitance of the sense amplifier, to provide a positive node capacitance change when the node is touched.

In presently preferred embodiments, each of the novel single-electrode touchpads, in an array of both spatially-multiplexed and non-spatially-multiplexed types, is surrounded by a shield electrode, with the shield electrode being driven to minimize the leakage current effect induced in each sensor of the array, as by touchpad electrode surface contamination and the like external influences. Level-clamping circuitry is utilized to assure reliable establishment of the "no-touch" output of the sensor to be greater than a reference condition, with the sensor output in the "touch" condition being reliably less than the reference, whereby the sensor output is established only by the presence or absence of the body-to-ground capacitance of a user contacting the associated touchpad electrode.

In another preferred embodiment, each of a multiplicity of sensors contains an additional impedance between the touchpad element and the sense amplifier, to able time-multiplex operation.

Accordingly, it is an object of the present invention to provide novel single electrode capacitive touchpad sensor and arrays thereof, for reliably ascertaining the presence or absence of a "touch" condition.

This and other objects of the present invention will become apparent upon consideration of the following detailed description, taken in conjunction with the drawings.

BRIEF DESCRIPTION OF THE DRAWINGS

FIG. 3 is a front view of a substrate containing an array of touchpad electrodes for a non-multiplexed touchpad array, and illustrating the positioning of a shield therefore;

FIG. 4 is a front view of a substrate containing an array of touchpad electrodes for a spatially-multiplexed array of single-electrode capacitive touchpad sensors;

DETAILED DESCRIPTION OF THE INVENTION

Figure 1:
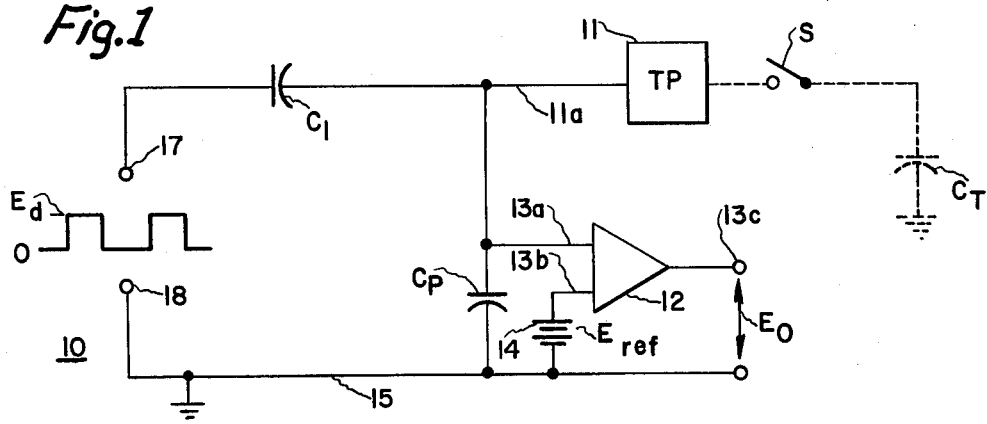
FIG. 1 is a schematic diagram of one of my novel single-electrode capacitive touchpad sensors, illustrating the principles of operation thereof.

Referring initially to FIG. 1, a capacitive touchpad sensor 10 includes a touchpad electrode 11, typically fabricated upon a surface of a dielectric substrate (illustrated in FIGS. 3 and 4 herein-below) to be accessible for contact by user personnel. A single lead 11a from touchpad 11 is utilized to couple the touchpad to one input lead 13a of a differential-input sense amplifier 12, having its remaining input lead 13b coupled to a source 14 of a reference potential $E_{ref}$. The remaining terminal of the reference source 14 is coupled to a common bus 15 of the sensor. Sense amplifier 12 has an input capacitance between inputs 13a and 13b, whereby a capacitance $C_p$ appears in shunt with the sense amplifier-source combination, that is, capacitance $C_p$ appears between touchpad electrode lead 11a and sensor common bus 15. One lead of a coupling capacity $C_1$ is connected to the junction between touch electrode lead 11a and sense amplifier input 13a, with the remaining lead of capacitor $C_1$ being connected to a sensor input terminal 17. A sensor input common terminal 18 is connected to common bus 15.

A waveform generator (not shown), as known to the art, is coupled between sensor input terminals 17 and 18 to provide a driving waveform. In my preferred embodiment, this driving waveform is a train of substantially rectangular, unipolar pulses having a resting level of essentially zero volts and a peak level of $E_d$ volts. A division of the driving pulse voltage amplitude occurs at the input of sense amplifier 12, for comparison against the reference voltage of reference source 14, whereby the magnitude $E_0$ of the potential at the sense amplifier output 13c is indicative of the contacting of touchpad electrode 11 by user personnel (indicated by closure of imaginary switch S, placing the user personnel body-to-ground capacitance $C_T$ between electrical ground and the junction of coupling capacitance $C_1$ and shunt capacitance $C_p$) or the non-contacting of touchpad electrode 11 by user personnel (indicated by the open condition of imaginary switch S, whereby body-to-ground capacitance $C_T$ is removed from the sensor circuit).

Touchpad electrode 11 is typically formed by metallizing an area upon a dielectric substrate with a quantity of a conductor or semiconductor material to form a circuit node thereat. Proper operation of the sensor requires that the coupling capacitance $C_1$ is very much larger than the shunt capacitance $C_p$ and that the body-to-ground capacitance $C_T$ is very much larger than the coupling capacitance. Typically, the body-to-ground capacitance $C_T$ is about 70 picofarads, and the equivalent input capacitance of the sense amplifier appearing as shunt capacitance $C_P$ is about 5 picofarads, whereby a coupling capacitance $C_1$ of about 22 picofarads may be utilized.

In operation, in the "no-touch" condition, capacitance $C_T$ is not present in the circuit and the relatively narrow pulses of the driving waveform are coupled to sense amplifier input 12a by the capacitive divider formed of coupling capacitance $C_1$ and shunt capacitance $C_p$. The "no-touch" voltage amplitude $E_1$ at sense amplifier input lead 13a is approximately equal to $(C_1 E_d)/(C_p + C_1)$. The magnitude $E_{ref}$ of reference source 14 is selected to be less than $E_1$ for the no-touch condition, whereby the magnitude $E_0$ of the voltage at sense amplifier output 13c, is of a first condition, e.g. a non-zero voltage. In the "touch" condition, where capacitance $C_T$ appears in parallel with shunt capacitance $C_P$, the magnitude $E_2$ of the voltage at sense amplifier input 13a is determined by the voltage divider formed by the coupling capacitance and the paralleled $C_T$ and $C_P$ capacitances, and is approximately equal to $(E_d(C_1))/(C_P + C_1 + C_T)$. The value of $C_1$ or $C_P$ may be adjusted as required to assure that the magnitude $E_2$ of the voltage at sense amplifier input 13a, in the touch condition, is less than the magnitude $E_{ref}$ of the reference source, whereby the magnitude $E_0$ at sense amplifier output 13c assumes a value different from the magnitude thereof in the "no-touch" condition, e.g. $E_o$ is approximately zero volts.

Figure 2:
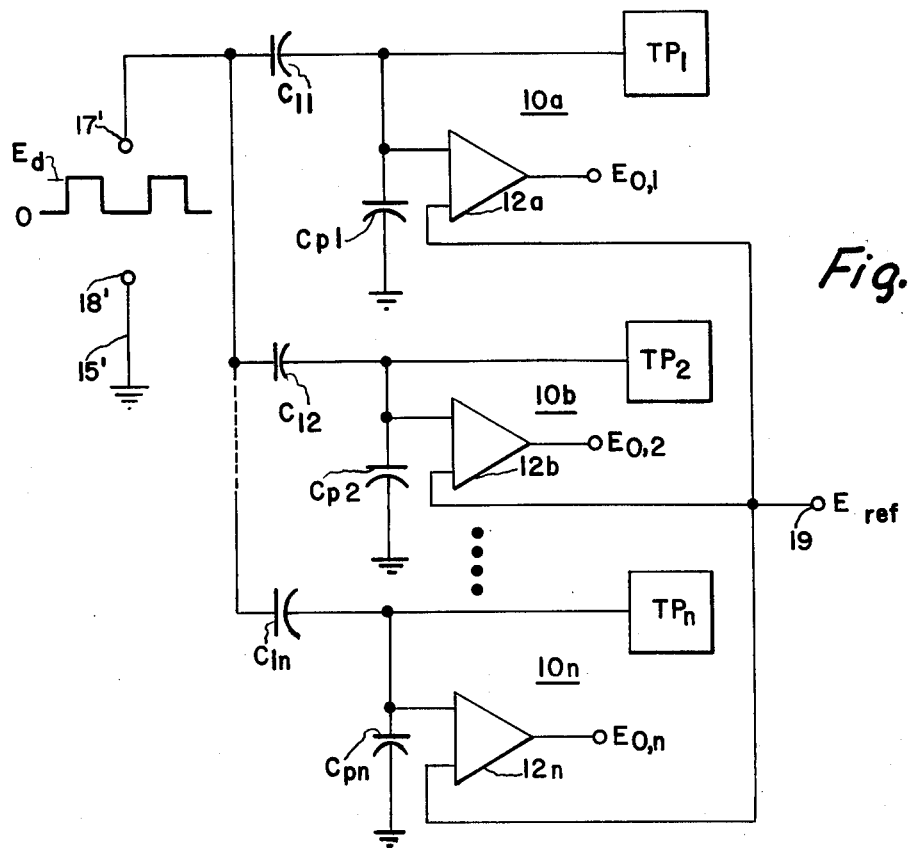
FIG. 2 is a schematic diagram of an array of the single-electrode capacitive touchpad sensors of FIG. 1.

Referring now to FIG. 2, an array of a plurality N of sensors 10 is formed by connecting together the coupling capacitor input lead, i.e. that lead of coupling capacitor $C_{11}$, $C_{12}$, ..., $C_{1n}$, furthest from the associated touchpad electrode $TP_1$, $TP_2$, ..., $TP_n$. The connected coupling capacitor input leads are connected to an array input terminal 17', while an array common bus 15' is coupled to another input terminal 18'. Pulse generation circuitry of known type is coupled between input terminals 17' and 18' to simultaneously drive all of the sensors with the unipolar pulse train, having a peak amplitude $E_d$. Each of the individual sensors $10a-10n$ in the array includes, in addition to its coupling capacitor $C_{11}-C_{1n}$, and the touchpad $TP_1-TP_n$ associated therewith, an associated sense amplifier $12a-12n$, having an input lead coupled to the junction between the coupling capacitor and touchpad electrode of the associated sensor. The input capacitance of each of sense amplifiers $12a-12n$ appears as a shunt capacitance $C_{p1}-C_{pn}$, coupled between the system ground bus and the junction beween the associated touchpad electrode and coupling capacitor. The remaining inputs of all of sense amplifiers $12a-12n$ are advantageously connected together to a single reference potential input 19, at which a voltage of magnitude $E_{ref}$ is impressed. The operation of each sensor $10a-10n$ in the array is identical to the hereinabove described operation of the single sensor. It should be understood that the array may have the touchpad electrodes $TP_1-TP_n$ arranged in linear or two-dimensional fashion, and may be of any practical size, being limited only by the ability of the driving circuitry, coupled between input terminals 17' and 18', to form pulses across the total capacitance of the array to be driven. The requirements on the driving circuitry complexity are reduced by the relatively large detectable difference in voltages appearing at the sense amplifier inputs in the "touch" and "no-touch" conditions. Illustratively, with the aforementioned values of shunt, coupling and body-to-ground capacitances, and with a pulse amplitude $E_d$ of about five volts (as available from TTL logic integrated circuits and the like), the sense amplifier input voltage $E_1$ in the "no-touch" condition is about four volts while the magnitude $E_2$ of the sense amplifier input voltage in the "touch" condition is about one volt. It will be seen that large relative differences in the sense amplifier input voltage are present and easily discernable by the sense amplifier, even for substantial percentage changes in the values of coupling, shunt and body-to-ground capacitance. Thus, reliable operation of the individual sensors in an array is facilitated and processing variation dependence is reduced.

Referring now to FIG. 3, a non-spatially-multiplexed array of touchpad sensors is fabricated upon a dielectric substrate 25. The touchpad electrodes $TP_{1,1}-TP_{3,3}$ are fabricated of a conductive or semiconductive material upon a surface 25a of the substrate, with the substrate being subsequently positioned for exposure to the external environment, whereby user personnel may contact one or more of the touchpad electrodes. In the illustrated embodiment, the nine touchpad electrodes are arranged in a 3×3 array, with each touchpad being of substantially square shape and separated from the remaining touchpads. It should be understood that the shape of the individual touchpads is a matter of design, as is the area of each thereof and the spacing therebetween. Advantageously, as the individual touchpads are not required to have a capacitive value with respect to other elements of the sensor array and system, in the "no-touch" condition (with the only capacitance being added to the system externally by a contact with a touchpad); the touchpad area can be reduced and the array sensor density can be increased.

Each touchpad is in connection with a conductive or semiconductive lead $27a-27i$, which may be fabricated at the same time as the associated touchpad is deposited upon the substrate surface, and may be fabricated of the same material as the touchpad electrode. Advantageously, all of the touchpads and their associated leads are fabricated in one simultaneous operation, such as by silk screening a film of a conductive material upon the substrate surface 25a. As will be seen, each touchpad electrode lead 25a-25i is spatially separated from every other lead and from all touchpads other than the touchpad to which the lead is connected. Each lead terminates in a single pad, aperture or other formation, known to the printed circuitry and the like arts, to allow connection of each lead to the associated coupling capacitor and an associated sense amplifier input. In the illustrated example, with nine independent touchpads, nine coupling capacitor-sense amplifier combinations are required. In very large arrays of M touchpad sensors, a total of M connections to the touchpad-electrode-bearing substrate (one connection to each of the M leads thereon) is required.

The touchpad-electrode-bearing substrate may advantageously be fabricated with the deposition of a shield electrode 29 covering a major portion of the area remaining after fabrication of the touchpads and associated leads, but being insulated therefrom. The shield provides a certain degree of isolation between each touch pad-lead group and may, as described hereinbelow, be coupled to the sensor circuitry to reduce effects of surface contamination and like, which contamination may be brought about by deposit of skin oil and other contaminants from the contacting portion of the user personnel onto the substrate surface and contactible surface areas of the touchpad electrodes. A separate lead 29a is provided for the shield.

Referring now to FIG. 4, a very large array of capacitive sensors has a multiplicity of touchpad electrodes fabricated upon the surface 32a of a dielectric substrate 32, and is arranged for spatial-multiplexing to reduce the total number of leads to which connection must be made at the substrate. The spatially-multiplexed array of touchpad electrodes is fabricated as a two-dimensional matrix having J columns and K rows, with an additional column of K touchpads for enabling a row-select function. Thus, an array having M individual selectable functions, where $M=J \times K$, has a touchpad array of Kx ($J=1$) touchpads. Illustratively, for an array wherein $M=9$, $J=3$ and $K=3$, a total of 12 touchpads are utilized. The three touchpads $TP_{a,r}$, $TP_{b,r}$ and $TP_{c,r}$ are not spatially multiplexed, due to their use as row selectors, and are each arranged one above the other on the substrate surface, with individual leads 35a, 35b and 35c being integrally connected to the associated row-select touchpad and separate from all other touchpads and interconnection leads. The remaining plurality ($J \times K$) of touchpads are arranged with J touchpads in each of the K rows and with connective leads integrally formed between each of the touchpads in a column and extending beyond one of the end touchpad electrodes in the column to form a lead for all of the K touchpads in that column to the remainder of the sensor circuitry associated with each column. Thus, touchpads $TP_{1,1}$, $TP_{2,1}$ and $TP_{3,1}$ of column 1 of the array, are interconnected by lead portion 37a (between touchpad electrode $TP_{1,1}$ and $TP_{2,1}$) and lead portion 37b (between touchpad electrode $TP_{2,1}$ and $TP_{3,1}$) with an additional lead portion 37c extending from an edge of touchpad electrode $TP_{3,1}$ opposite the remainder of the touchpad electrodes in that column, to provide a lead for connection to the single coupling capacitor and single sense amplifier for the touchpad column 1 sensor. Similarly, electrode interconnective and lead portions 38a, 38b and 38c are utilized to interconnect the touchpads $TP_{1,2}$, $TP_{2,2}$, and $TP_{3,2}$, forming column 2, while interconnective and lead portions 39a, 39b and 39c are utilized to connect touchpad electrodes $TP_{1,3}$, $TP_{2,3}$, and $TP_{3,3}$ to form the $J=3$ column furthest from the column of row-select touchpad electrodes. It should be understood that the spatially-multiplexed touchpad sensor array may be utilized with or without a shield electrode, and the spatially-multiplexed array of FIG. 4 is, for purposes of illustration, shown without the presence of the shield.

The spatially-multiplexed array of sensors is operated by user personnel initially contacting that one of row-select touchpads $TP_{a,r}$–$TP_{c,r}$ to designate that one of rows 1-K in which the desired touchpad is found. Illustratively, if the input function requires that data associated with touchpad $TP_{3,2}$ be input to a system to which the touchpad sensor array is coupled, the row-select touchpad $TP_{c,r}$ is initially contacted to select the $K=3$ (bottom) row, and then the individual touchpad electrode along that row e.g. touchpad electrode $TP_{3,2}$ (in column 2), is contacted to complete the input function. It should be understood that suitable storage means, such as logic latches and the like, and logic gating means (not shown), such as are known to the art, are utilized to: store the output of one of the sense amplifiers associated with the row-select portion of the array; store the output of one of the sense amplifiers coupled to a particular column (with one sense amplifier being coupled to each individual one of the column leads 37c, 38c or 39c); and logically detect the presence of a particular column and row signal from the storage means to determine which element of the matrix has been entered. It should also be understood that the use of non-spatially-multiplexed row-select sensors with a spatially-multiplexed column-connected sensor array allows the number of connections to substrate 32 to be minimized relative to the non-spatially-multiplexed sensor array of FIG. 3, e.g. for a nine-element array, the spatially-multiplexed embodiment (FIG. 4) requires only six contacts, while the non-spatially-multiplexed embodiment requires nine contacts. It will be seen that even greater reduction of substrate connections occur for large arrays, e.g. for a ten by ten array (100 elements), the non-spatially-multiplexed array requires 100 individual connections, while the spatially-multiplexed array requires only 20 connections.

Figure 5:
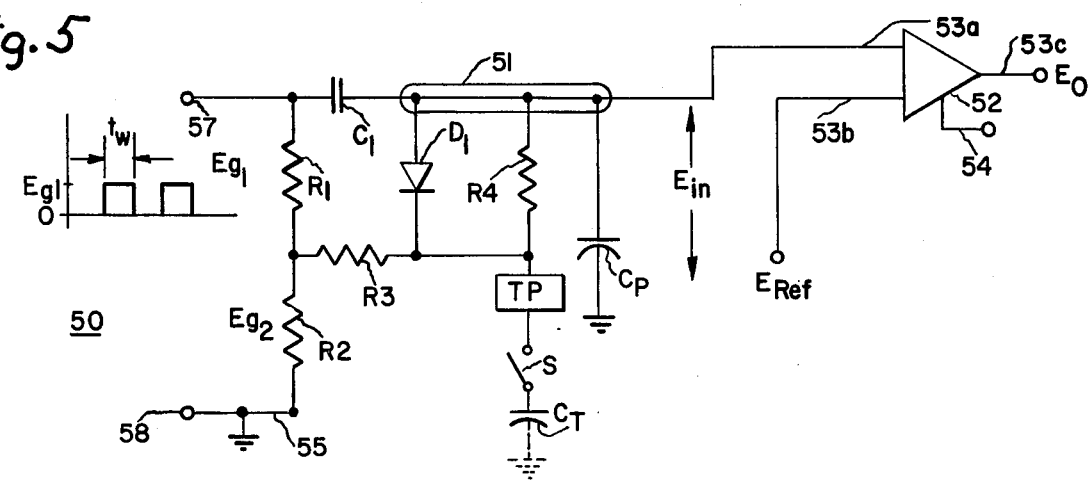
FIG. 5 is a schematic diagram of a capacitive touchpad sensor having a level-clamping network.
Figure 6:
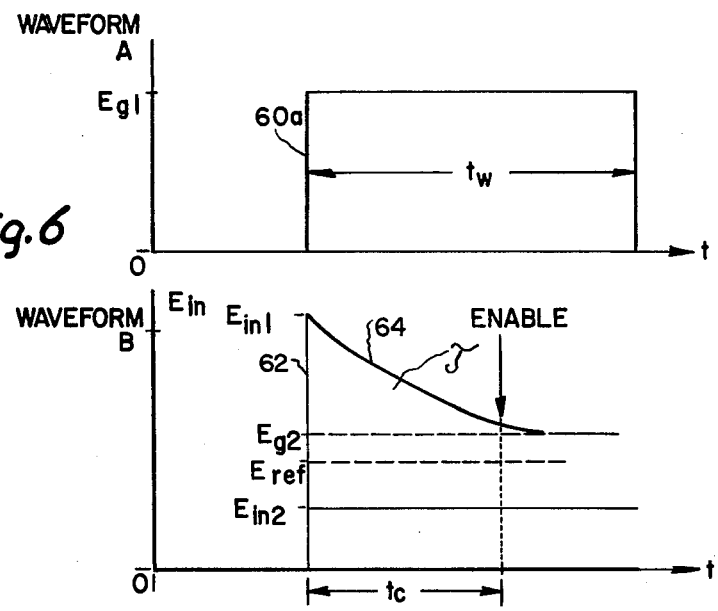
FIG. 6 is a pair of coordinated graphs illustrating the driving and response waveforms for the sensor of FIG. 5.

Referring now to FIGS. 5 and 6, reliable operation with relatively low drive voltages is further assured by incorporating a noval level clamping network into each sensor 50 of an array. It should be understood that the touchpad electrode TP, shown for the level-clamped capacitor touchpad sensor 50, may be a single touchpad electrode, in a non-spatially-multiplexed array, or may be any one of a plurality of touchpad electrode areas connected together to form one column (or row) of a spatially-multiplexed array. The clamped sensor 50 contains, in addition to the touchpad electrode TP (and its imaginary switch S representing the contact or non-contact of the body-to-ground capacitance $C_T$ thereto), a sense amplifier 52 having one input 53a thereof coupled to a common node 51' and having a remaining input 53b coupled to a source of reference potential of magnitude $E_{ref}$. A capacitance $C_p$ is connected between the touchpad-sense amplifier input junction and a sensor ground bus 55; the shunt capacitance $C_P$ may be the equivalent input capacitance of the sensor amplifier, either alone or in parallel with an additional physical capacitance.

A pair of electrical resistances $R_1$ and $R_2$ are series connected between a sensor input terminal 57 and a common terminal 58, coupled to a common bus 55. A driving waveform, comprised of a train of unipolar pulses having a resting amplitude of approximately zero volts and a peak amplitude of $E_{g1}$ volts, with a predetermined pulse width $T_w$, is applied between input terminals 57 and 58. The values of resistances $R_1$ and $R_2$ are selected to provide a Thevenin equivalent source having an output voltage $E_{g2}$ and having a very low source impedance equal to the parallel combination of $R_1$ and $R_2$. Another electrical resistance $R_3$ is coupled from the junction of resistance $R_1$ and $R_2$ to the touchpad electrode TP. Coupling capacitor $C_1$ is connected between sensor driven input terminal 57 and node 51; node 51 is also connected to the anode of a diode $D_1$, having its cathode coupled to the junction of resistance $R_3$ and the touchpad electrode TP. A resistance $R_4$ of relatively high value is coupled across diode $D_1$.

In operation, the Thevenin equivalent voltage $E_{g2}$ is predeterminately selected, by choice of suitable values for resistances $R_1$ and $R_2$, to be greater than the reference voltage $E_{ref}$ applied to sense amplifier lead 53b. Commencing with the rising edge 60a of the input pulse (FIG. 6, waveform A) the voltage $E_{in}$ (between sense amplifier input lead 53a and sensor ground) instantaneously rises to a value $E_{in1} = D_N(E_{g1} - V_{D1}) + V_{D1}$, where $K_N$ is the "no-touch" capacitance ratio $(C_1/(C_1+C_p))$ and $V_{D1}$ is the "on" voltage across diode $D_1$. This instantaneous rise of the sense amplifier input waveform (FIG. 6, waveform B) is shown as edge 62. The amplitude $E_{in1}$ is selected to be greater than the steady state Thevenin equivalent voltage $E_{g2}$, which is itself greater than the reference voltage.

The output voltage of sense amplifier 52 is latched at a time $t_c$ following the leading edge 60a of drive pulse $E_{g1}$ when an enable signal arrives on line 54. The time $t_c$ should be about one time constant $\tau$ of the clamped sensor circuit in the "no-touch" condition, and should also be much less than the time constant of the circuit in the "touch" condition, in which condition the circuit includes resistance tending to charge capacitor $C_1$ such that $E_{in}$ asymptotically approaches $E_{g2}$. The drive pulse width $t_w$ of $E_{g1}$ must therefore be greater than $t_c$. Thus, the input voltage $E_{in}$ is greater than the Thevenin voltage $E_{g2}$ and always greater than the reference voltage $E_{ref}$, to assure that the amplifier output 53c is "off" and the no-touch condition is reliably indicated by the state of the sense amplifier output voltage $E_o$.

In the "touch" condition, the sense amplifier input voltage $E_{in}$ assumes an initial value of $E_{in2} = K_T(E_{g1} - V_{D1}) + V_{D1}$ where $K_T = (C_1/(C_1 + C_P + C_t))$. The touch constant $K_T$ is selected such that the voltage $E_{in2}$ is always less than both the Thevenin voltage $E_{g2}$ and the reference voltage $E_{ref}$, prior to enablement of the sense amplifier latch, whereby the differential sense amplifier input voltage $(E_{ref}K - E_{in2})$ is reliably detected by the sense amplifier to enable another condition of output voltage $E_o$, indicative of the "touch" condition, at sense amplifier output 53c.

Diode $D_1$ prevents the sensor node voltage $E_{in}$ from charging to the reference level $E_{g2}$ prior to enablement of sense amplifier 52 and the comparator action thereof during touch conditions. Resistance $R_4$ acts to discharge coupling capacitor $C_1$ during the interval between driving pulses, i.e. when the input pulse level is essentially equal to zero volts; resistance $R_4$ is selected such that the time constants of resistance $R_4$ and coupling capacitor $C_1$ is much greater than the driving voltage pulse width $t_w$, but much less than the cycle time of the drive signal $E_{g1}$, whose duty cycle is relatively low, e.g. a duty cycle of about 0.001.

Figure 7:
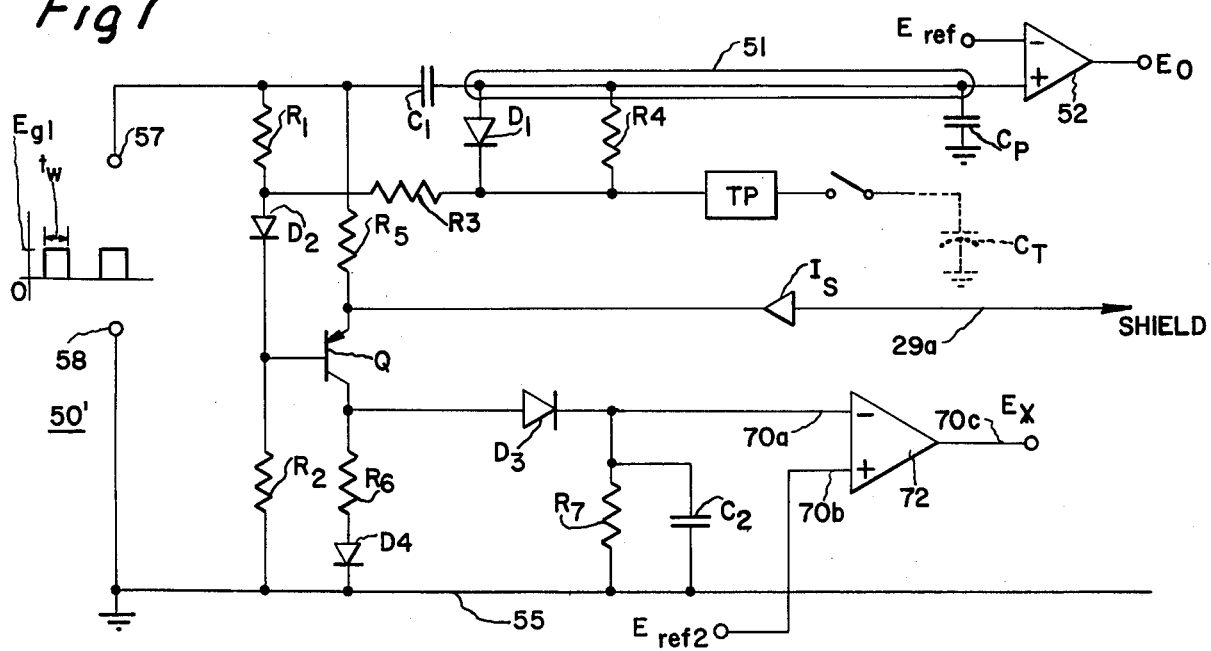
FIG. 7 is a schematic diagram of a capacitive touchpad sensor having a level-clamping network and an active network for driving a sensor array shield to minimize effects of surface contamination.

Referring now to FIG. 7, minimization of surface contamination effects and cross-talk with an array of touchpads is provided by isolating each touchpad and lead thereof by the aforementioned conductive shield, preferably formed of a thin film of a conductive material, such as indium tin oxide and the like. Advantageously, the shield has a very low circuit impedance to provide the desired reduction in cross-talk, i.e. touchpad-to-touchpad coupling. In the event of surface contamination, the shield current $I_s$ is a non-zero value, generated by the contamination current flowing through the low circuit impedance. The shield contamination current is conducted to sensor circuit 50' via shield lead 29a.

Sensor circuit 50', wherein like reference designations are utilized, with respect to FIG. 5, for like functions, also includes a diode $D_2$ having its anode coupled to the junction of resistance $R_1$ and $R_3$, and having its cathode coupled to resistance $R_2$. A PNP transister Q has its base electrode coupled to the junction between the cathode of diode $D_2$ and resistance $R_2$; the emitter electrode of transistor Q is connected to shield lead 29a and is also connected to sensor circuit input terminal 57 via an emitter resistance $R_{51}$, while the collector of transistor Q is connected to the anode of a detector diode $D_3$ and is also connected to common bus 55 via a series circuit including a collector resistance $R_6$ and a diode $D_{42}$. The cathode of the detector diode is coupled to a diode detector load consisting of a capacitor $C_2$ and a resistance $R_7$, both of which have their remaining terminals coupled to common bus 55. The inverting (−) input 70a of a second sense amplifier (comparator) 72 is coupled to the junction between the detector diode cathode, capacitor $C_2$ and resistor $R_7$. The non-inverting input 70b of the sense amplifier is connected to a source of a second reference voltage $E_{ref2}$. The sense amplifier output 70c provides a signal $E_x$, indicative of the comparison of shield contamination current against a reference voltage $(E_{ref2})$.

In operation, prior to the first driving pulse of amplitude $E_{g1}$, the potential difference between input terminals 57 and 58 is essentially zero and transistor Q is cut-off, whereby a current of substantially zero magnitude flows through collector resistance $R_6$ and diode $D_4$. The collector resistance voltage drop is thus approximately zero and the detector capacitance $C_2$ is charged to substantially zero volts. The detector load capacitance voltage appears at sense amplifier input 70a and is less than the magnitude $E_{ref2}$ of the reference voltage at the remaining comparator input lead 70b, whereby the sense amplifier output 70c is in a first condition indicative of shield current being less than the limit established by the magnitude $E_{ref2}$.

Upon occurrence of the first driving pulse, the voltage at input terminal 57 rises to a magnitude $E_{g1}$ and the base electrode of transistor Q receives a voltage of magnitude $(((E_{g1} - E_{d2})R_2(R_1 + R_2)) - R_2)$, where $E_{d2}$ is the voltage drop across diode $D_2$. The value of resistance $R_5$ is selected such that the emitterbase diode of the transistor is forward biased and emitter current is injected into the emitter electrode of the transistor. The magnitude of the total emitter electrode current is the sum of the shield current (received via lead 29a) and the current injected by resistance R$_5$, due to the difference in potential thereacross. The summed currents flow from the transistor collector electrode and through resistance R$_6$ and diode D$_4$ to ground whereby a voltage drop exists thereacross, which voltage is the sum of a steady voltage due to the current injected by action of emitter resistance R5 and a voltage due to the injection of the shield current. As increasing values of shield current are injected into the emitter of the transister, the voltage at the anode of detector D$_3$ rises. The increase in the voltage further forward-biases detector diode D3 and causes additional current to be injected into capacitance C$_2$ to increase the voltage thereacross, at the inverting input 70a of the shield sense amplifier. During the time intervals between driving pulses, the voltage across collector resistance R$_6$ falls substantially to zero, whereby the cathode of detector cathode D$_3$ is at a higher potential than the anode thereof, and the diode is cut-off. Detector load resistance R$_7$ is of a reasonably high resistance value, whereby the decay of the voltage across capacitance C$_2$ is relatively slight between driving pulses, but still decays to zero if the drive is removed from the sensor circuit for several seconds.

The increasing shield current, due to surface contamination and the like effects, causes the shield sense amplifier input voltage to rise until the voltage at input 70a is equal to the magnitude E$_{ref2}$ of the voltage at shield sense amplifier second input 70b, whereupon the shield sense amplifier output 70C is switched to a second condition to provide another voltage E$_x$ to associated circuitry (not shown). The change in amplitude of the shield sense amplifier output voltage E$_x$ indicates that the shield current has exceeded the preselected magnitude, determined by the shield sense amplifier reference voltage magnitude E$_{ref2}$. The external circuitry, receiving the level change from the output of shield sense amplifier 72, will act upon the excessive shield current in manner as determined by the end application, e.g., refusing to accept input data from the touch-pad array and causing a visible, audible and the like, signal to be presented to user personnel to signify that unacceptable surface contamination and the like levels are present. Diodes D$_2$ and D$_4$ may be used to provide temperature compensation of the emitter-base diode of transistor Q and of detector diode D$_3$.

In the illustrated preferred embodiment, each touchpad in a non-spatially-multiplexed array, or each interconnected string of touchpads in a spatially-multiplexed array, is coupled to its individual, associated sensor circuit. The multiplicity of sensor circuits, as discussed hereinabove with reference to FIG. 2, are all simultaneously driven by a single pulse generator and all sense amplifiers would be simultaneously enabled. In large arrays, the input capacitance, between input terminals 57 and 58, of each of the sensor circuits is additive and may require that the driver circuit be capable of causing a relatively large charging current flow. Similarly, the number of sense amplifiers required in a large array, even of the spatially-multiplexed type, requires that numerous sense amplifiers be utilized, with the attendant problems of relatively high power consumption, cost and physical volume.

It is also desirable to be able to time-multiplex the sensors of the array.

Figure 8:
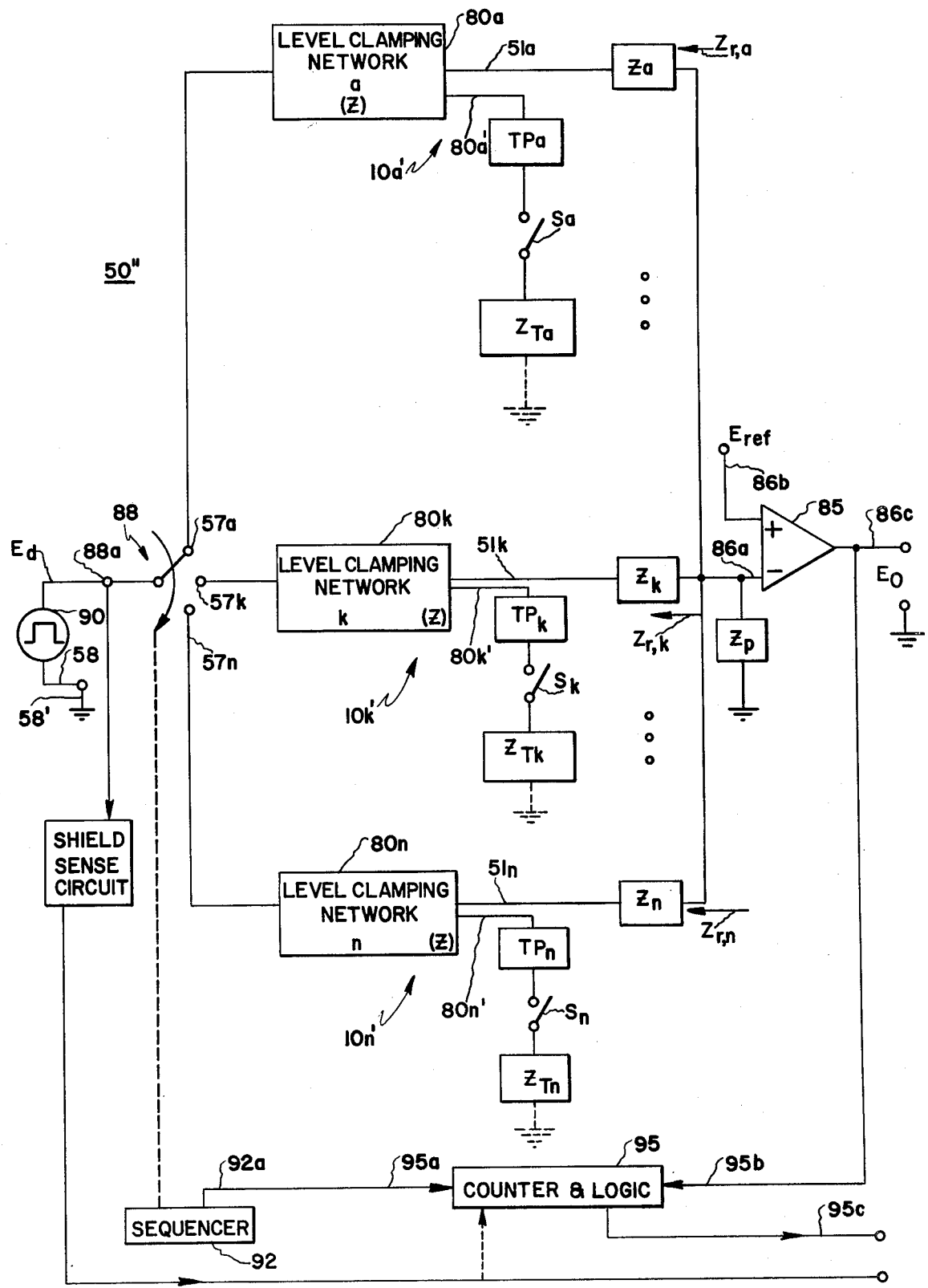
FIG. 8 is a schematic block diagram of a time-multiplexed array of a plurality of capacitive touchpad sensors.

Referring now to FIG. 8, a time-multiplexed array 50" includes a plurality N of sensors 10a'-10n', each having an associated 2-terminal impedance Z$_a$-Z$_n$ with one terminal of each thereof connected to the output node 51a-51n of the associated level-clamping network 80a-80n. The remaining terminal of each of the impedances Z$_a$-Z$_n$ are connected together to the junction of the sense amplifier input 86a. A parallel impedance Z$_p$, which may be the input capacitance C$_P$ of the sense amplifier, augmented as required by additional parallel impedance, is also connected to sense amplifier input 86a. It should be understood that the series impedance Z$_a$-Z$_n$, in this more general case, is also present in the capacitive touchpad sensor circuits of FIGS. 1, 2, 5 and 7, but has assumed an essentially zero value therein; in the time-multiplexed sensor circuit of FIG. 8, the impedance Z$_a$-Z$_n$ each have a non-zero value. The touchpad TP$_a$-TP$_n$, associated with each sensor 10$_a$'-10$_n$' is connected to the associated level-clamping network at the junction 80$_a$'-80$_n$' of resistances R$_3$ and R$_4$ thereof (see FIG. 5 or FIG. 7).

A single sense amplifier 85 is utilized with the plurality of touchpad sensor circuits, as the input 86a can be coupled to the junction of parallel impedance Z$_p$ and the multiplicity of interconnected impedances Z$_a$-Z$_n$. The remaining sense amplifier input 86b is coupled to a source of reference potential of magnitude E$_{ref}$. The input terminal 57a, . ., 57k, . . 57n of the associated individual sensor signal level clamping networks 80a, . ., 80k, . ., 80n are each connected to one selectable contact of a N-position switch means 88. The driving pulse generator 90 is coupled between the common contact 88a of switch means 88, and the system common ground 58'. Switch means 88 is caused to sequentially connect common contact 88a (and the output of pulse generator 90) to each of the touchpad circuit inputs 57a-57n in succession, by action of a sequencer 92 operatively coupled to switch means 88. The nature of sequencer 92 is itself known to the art and is determined by the type of switch means 88 utilized; if switch means 88 is a mechanical stepping relay, sequencer 92 may be a current pulse generator for causing the switch means to step through its plurality of positions. It should be understood that electro-mechanical and electronic switching means may be utilized for the N-position, single-pole switch means 88, with an electronic switching configuration being preferred for purposes of integrating the entire array in the smallest possible volume; if an electronic switching means 88 is utilized, sequencer 92 may be configured of an oscillator and suitable shift register for sequentially connecting common contact 88a to the input of each sensor network inputs 57a-57n, in known manner. An output 92a of sequencer 92 is energized for each movement of the switch means contact, whereby a counter and logic means 95 receives, at a first input 95a thereof, a series of energization signals corresponding to the number of movements of the contacts of switch means 88, so that a counter in means 95 has stored thereat a count indicative of which of the N sensor circuits is being driven at that particular instant. Counter and logic means 95 also receives a second input 95b from the output 86c of sense amplifier 85, whereby a change in the amplitude of sense amplifier output voltage E$_o$ is received and causes the signal stored in the count portion of means 95 to be made available on output connection 95c, to indicate contact with the touchpad electrode of the particular sensor then energized.

Accordingly, in operation, sequencer 92 initially causes pulse generator 90 to be coupled via switch means 88 to input terminal 57a of the first touchpad sensor circuit $10a'$; simultaneously therewith, sequencer input $92a$ causes the counter portion of means 95 to store therein a count indicative of the first sensor circuit being then enabled. If user personnel are not contacting the touchpad $TP_a$ associated with first sensor circuit $10a'$, when the pulse generator is connected to the input $57a$ thereof, the switch $S_a$ is open and the body-to-ground impedance $Z_{Ta}$ is not coupled via forward biased diode $D_1$ (see FIGS. 5 or 7), to the junction between the series impedance $Z_a$ and the series impedance Z of the signal level-clamping network. Therefore, the voltage at sense amplifier input $86a$ is the generator output pulse voltage acted upon by a simple voltage divider consisting of a series arm having an impedance magnitude equal to the series impedance of the level-clamping network impedance Z and the isolation impedance $Z_a$, and a shunt arm consisting of the parallel impedance $Z_p$, in electrical parallel connection with the equivalent output impedances $Z_{r,x}$ (where $a \leq x \leq n$) of the $(n-1)$ sensors not then being driven by the generator. If the touchpad for a sensor circuit other than the one presently being driven is contacted, the output impedance of the one touched decreases and the shunt impedance $Z_p$ is paralleled by $(n-2)$ sensor output impedances $Z_r,x$ and is also paralleled by the now-decreased series combination of the isolating impedance $Z_a$-$Z_n$ for that sensor and the body-to-ground capacitance of the user personnel. Thus, if the k-th touchpad $TP_k$ is touched (and switch $S_k$ thus closed) while the first touchpad sensor circuit $10a'$ is driven, the series equivalent combination of impedance $Z_k$ and impedance $Z_{Tk}$ appears in parallel with shunt impedance $Z_p$, and the output impedances of the $(n-2)$ other sensors; the isolation impedances $Z_a$-$Z_n$ are of a magnitude selected to minimize the effect of contact of a touchpad for a sensor circuit other than the one presently energized.

In the "touch" condition, e.g. switch $S_a$ closed to couple the body-to-ground impedance $Z_{Ta}$ in effect from the system common to the junction of the level-clamping network impedance Z and the first sensor circuit isolation impedance $Z_a$, a further attenuation of the pulse voltage magnitude occurs. Therefore, in the "touch" condition, the magnitude of the voltage at amplifier input $86a$ falls to a magnitude less than the magnitude thereat in the "no-touch" condition; the magnitude $E_{ref}$ reference voltage at sense amplifier input $86b$ is established to be essentially midway between the two levels to facilitate acquisition of the touch or no-touch inputs.

It should be understood that each of the impedance elements (the level clamping network impedance Z, the isolation impedance elements $Z_a$-$Z_n$, the body-to-ground impedance $Z_{Ta}$, and the parallel impedance element $Z_p$) can in the general case, be capacitive or resistive or a combination thereof, as required by the particular usage of the time-multiplexed sensor circuitry. This is particularly advantageous in that the net network impedance Z and the isolation impedances $Z_a$-$Z_n$ can be fabricated, if desired, as thin or thick film elements, on the surface of the substrate on which the touchpad electrodes are themselves fabricated, and with the elements being fabricated as patterns of conductive, semiconductive and/or insulative films in relationship to one another and as known to the art. It should be further understood that a single shield sense amplifier and circuit, shown in FIG. 7, can be connected to the switch means common terminal $88a$ to constantly monitor shield contamination current, regardless of which of the N sensor circuits is presently energized; the output of the shield sense amplifier can be utilized to disable the counter and logic means output $95c$, if desired, and in addition to energizing other alarm-type functions.

While several preferred embodiments of my novel single-electrode capacitive touchpad sensor system have been described in detail herein, many variations and modifications will now become apparent to those skilled in the art. It is my intent, therefore, to be limited only by the scope of the appending claims and not by the specific details described with reference to the preferred embodiments herein.

What is claimed is:

1. A sensor for indicating the presence or absence of direct contact by a human member, comprising:
   a sensor common bus;
   first means for receiving a driving signal of at least one sequential pulse of a substantially predetermined peak amplitude with respect to said common bus;
   a touchpad electrode formed of a conductive or semi-conductive material and adapted to be directly contacted by said member;
   a linear first impedance element connected between said first means and said touchpad electrode;
   a second impedance element connected between said common bus and the junction between said first impedance element and said touchpad electrode;
   a sense amplifier having an output and first and second inputs, said first input connected to the common junction of said first and second impedance elements and said touchpad electrode; and
   second means coupled to said sense amplifier second input for providing a reference potential independent of said driving signal and of an essentially constant and predetermined non-zero value less than the peak amplitude of the driving signal;
   the output of said sense amplifier being in one of first and second conditions responsive respectively to the first input receiving portions of the driving signal respectively having greater than and less than the value provided by said second means in the respective presence and absence of contact of said touchpad electrode by said member.

2. The sensor of claim 1, wherein said first impedance element is a capacitor.

3. The sensor of claim 1, wherein said second impedance element is a capacitor.

4. In combination, a plurality of the sensors of claim 1, wherein the common busses of all of said plurality of sensors are coupled together; the first means of all of said plurality of said sensors are coupled together to form a single signal receiving means; and said reference potential providing means is coupled in parallel to all of the second inputs of the plurality of sense amplifiers.

5. The combination set forth in claim 4, further comprising a planar substrate having a surface, the touchpad electrodes of said plurality of sensors being fabricated as conductive areas upon said substrate surface.

6. The combination set forth in claim 5 wherein said plurality of touchpads electrodes are fabricated in a two-dimensional array.

7. In combination, a plurality of sensors for indicating the presence or absence of contact by a member, each sensor having:
   a sensor common bus;

first means for receiving a driving signal of at least one sequential pulse of a substantially predetermined peak amplitude with respect to said common bus;
a conductive touchpad electrode adapted to be contacted by said member;
a first impedance element connected between said first means and said touchpad electrode;
a second impedance element connected between said common bus and the junction between said first impedance element and said touchpad electrode;
a sense amplifier having an output and first and second inputs, said first input connected to the common junction of first and second impedance elements and said touchpad electrode; and
second means coupled to said sense amplifier second input for providing a reference potential of an essentially constant and predetermined value less than the peak amplitude of the driving signal;
the output of said sense amplifier being in one of first and second conditions responsive respectively to the first input receiving portions of the driving signal respectively having greater than and less than the value provided by said second means in the respective presence and absence of contact of said touchpad electrode by said member;
a planar substrate having a surface, said plurality of touchpad electrodes of said plurality of sensors being fabricated as conductive or semiconductive areas upon said substrate surface;
the common buses of all of said plurality of sensors being coupled together;
the first means of all of said plurality of sensors being coupled together to form a single receiving means;
said reference potential providing means being coupled in parallel to all of the second inputs of the plurality of sense amplifiers; and
a conductive shield electrode fabricated upon at least a portion of the substrate surface adjacent to, but insulated from, at least one of said plurality of touchpad electrodes;
means for providing a second reference potential; and
third means coupled to said shield electrode for providing an output signal when the magnitude of a current in said shield electrode exceeds a reference magnitude determined by the magnitude of the second reference potential.

8. The combination as set forth in claim 7, further comprising means in each sensor circuit for level-clamping the magnitudes of the signals at the sense amplifier first input in the contact and no-contact conditions.

9. The combination as set forth in claim 8, wherein each level-clamping means comprises: fourth means for providing another signal duplicating the driving signal at a reduced amplitude; and a resistance element coupling said another signal to the first inputs of all of said sense amplifiers.

10. The combination as set forth in claim 9, wherein said fourth means includes first and second electrical resistance elements coupled between said first means and said common bus, said another signal being coupled from the junction between said first and second resistance elements.

11. The combination as set forth in claim 10, wherein said level-clamping means further includes a diode having its anode coupled to said first impedance element and to the sense amplifier first input and its cathode coupled to the junction between said resistance element and said touchpad electrode; and another resistance element connected in parallel across said diode.

12. The combination as set forth in claim 11, wherein said at least one pulse of said driving signal has a predetermined pulse width; said first impedance element is an electrical capacitance; and said another resistance has a magnitude selected to cause the time constant of said another resistance and the capacitance of said first impedance element to be greater than the driving signal pulse width.

13. The combination as set forth in claim 12, wherein said third means comprises: fifth means responsive to the magnitude of said shield current for providing a voltage of magnitude proportional thereto; and another sense amplifier having first and second inputs and an output; said another sense amplifier first input receiving said voltage proportional to said shield current and said another sense amplifier second input receiving said second reference voltage; said sense amplifier output being at one of first and second conditions responsive respectively to the shield-current-proportional voltage being respectively greater than and less than said second reference voltage.

14. The combination as set forth in claim 13, wherein said fifth means comprises a semiconductor device having first, second and third electrodes, the current flowing from said first electrode being proportional to the sum of currents flowing into said second electrode; a diode coupled between said first and second resistance elements to allow current to flow only towards the second resistance element; said semiconductor device third electrode being coupled to the junction between said diode and said second resistance element; means coupled between said first means and said device second electrode to cause a first current to flow into said device second electrode; said shield electrode being coupled to said device second electrode to inject a second current thereto; a load resistance coupled between said device first electrode and said common bus and having a voltage appearing thereacross proportional to the sum of said shield and injected currents; and means for detecting the magnitude of the voltage across said load resistance to provide the signal to said first input of said another sense amplifier.

15. The combination as set forth in claim 14, wherein said detector means comprises a diode detector coupled between said device first electrode and the first input of said another sense amplifier; and a detector load resistance and a detector load capacitance connected in parallel between said another sense amplifier first input and said common bus.

16. An array of sensors for performing a selected one of a plurality of data input functions responsive to contact by a member, said array comprising;
a substrate having a surface;
a two-dimensional array of conductive or semiconductive touchpad electrodes fabricated upon the surface of said substrate, each electrode of the array being electrically isolated from all other electrodes of the array;
a system ground bus;
means for providing a reference voltage of essentially constant magnitude;
a sense amplifier having a first input, a second input receiving said reference voltage, and an output caused to be at one of first and second conditions responsive to a voltage at said first input being respectively greater than and less than the reference voltage at said second input;

an impedance element coupled between said sense amplifier input and said common bus;

a plurality of networks each having first, second and third terminals, the impedance of each network between pairs of said terminal being substantially identical to the impedance between like pairs of said terminals in all like networks; the first terminal of each network being coupled to an associated one of said plurality of touchpad electrodes;

a plurality of isolation impedances, each isolation impedance being coupled from a second terminal of an associated level-clamping network to said sense amplifier first input;

means for generating a sequence of pulses having a peak voltage amplitude greater than the amplitude of said reference voltage;

means for connecting the pulse generating means sequentially to the third terminal of successive ones of said plurality of networks; and means for recognizing a change in the condition of the output of said sense amplifier to determine which of said touchpad electrodes has been contacted by said member.

17. The sensor array of claim 16, further comprising a shield electrode fabricated unto said substrate surface adjacent to, but electrically isolated from, at least a portion of said array of touchpad electrodes.

18. The sensor array as set forth in claim 17, further including means coupled at least to said shield electrode for disabling said recognizing means if a current in said shield electrode exceeds a predetermined magnitude.

19. The sensor array as set forth in claim 16, wherein said array is adapted to recognize each of a total of $J \times K$ data functions, said matrix being composed of $J+1$ columns and K rows of touchpad electrodes, all of the K touchpad electrodes in each of J columns being connected together in parallel, the J sets of connected touchpad electrodes being coupled to J network first terminals; the remaining K touchpads in the $J+1-$st row being individually connected to an associated one of K network first terminals.

20. The sensor array set forth in claim 19, wherein said recognizing means is adapted for initially recognizing contact of said members with one of the K touchpad electrodes in the $J+1$-st row and for subsequently recognizing contact of said member with one of J columns as being a contact of the touchpad electrode in the K-th row of that column having the touchpad electrode initially contacted by said member.

* * * * *